(12) United States Patent
Barrows et al.

(10) Patent No.: US 9,070,791 B2
(45) Date of Patent: Jun. 30, 2015

(54) TUNABLE CAPACITOR

(75) Inventors: Corey K. Barrows, Colchester, VT (US); Joseph A. Iadanza, Hinesburg, VT (US); Edward J. Nowak, Essex Junction, VT (US); Douglas W. Stout, Milton, VT (US); Mark S. Styduhar, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 920 days.

(21) Appl. No.: 11/923,864

(22) Filed: Oct. 25, 2007

(65) Prior Publication Data
US 2009/0108320 A1    Apr. 30, 2009

(51) Int. Cl.
*H01L 29/94*    (2006.01)

(52) U.S. Cl.
CPC ...................................... *H01L 29/94* (2013.01)

(58) Field of Classification Search
USPC ............... 257/68, 71, 295–313, 905–908, 257/E29.345
See application file for complete search history.

(56) References Cited

U.S. PATENT DOCUMENTS

| 3,890,631 | A | * | 6/1975 | Tiemann | 257/312 |
| 3,890,635 | A | * | 6/1975 | Engeler | 257/312 |
| 3,893,152 | A | * | 7/1975 | Lin | 257/324 |
| 4,216,451 | A | | 8/1980 | Nishimura et al. | |
| 4,605,922 | A | * | 8/1986 | Blattman et al. | 340/552 |
| 5,801,411 | A | * | 9/1998 | Klughart | 257/296 |
| 5,914,513 | A | * | 6/1999 | Shenai et al. | 257/312 |
| 5,959,504 | A | | 9/1999 | Wang | |
| 6,646,489 | B1 | * | 11/2003 | Tchagaspanian | 327/427 |
| 6,844,613 | B2 | | 1/2005 | Shimizu | |
| 7,363,597 | B2 | * | 4/2008 | Uchida | 716/115 |
| 7,701,270 | B2 | * | 4/2010 | Wyatt et al. | 327/157 |
| 2004/0114302 | A1 | | 6/2004 | Maget | |
| 2004/0246653 | A1 | | 12/2004 | Williams | |
| 2005/0083105 | A1 | | 4/2005 | Matsuura et al. | |
| 2005/0218947 | A1 | | 10/2005 | Tanaka | |
| 2006/0081936 | A1 | * | 4/2006 | Kim et al. | 257/365 |
| 2006/0197111 | A1 | * | 9/2006 | Matsuzawa | 257/206 |

(Continued)

OTHER PUBLICATIONS

Barrows et al., U.S. Appl. No. 11/560,126, Office Action Communication, Jan. 6, 2009, 11 Pages.

(Continued)

*Primary Examiner* — Ha Tran T Nguyen
*Assistant Examiner* — Jordan Klein
(74) *Attorney, Agent, or Firm* — Gibb & Riley, LLC; Michael J. LeStrange, Esq.

(57) ABSTRACT

Disclosed are embodiments of a design structure transistor that operates as a capacitor and an associated method of tuning capacitance within such a capacitor. The embodiments of the capacitor comprise a field effect transistor with front and back gates above and below a semiconductor layer, respectively. The capacitance value exhibited by the capacitor can be selectively varied between two different values by changing the voltage condition in a source/drain region of the transistor, e.g., using a switch or resistor between the source/drain region and a voltage supply. Alternatively, the capacitance value exhibited by the capacitor can be selectively varied between multiple different values by changing voltage conditions in one or more of multiple channel regions that are flanked by multiple source/drain regions within the transistor. The capacitor will exhibit different capacitance values depending upon the conductivity in each of the channel regions.

12 Claims, 4 Drawing Sheets

(56) References Cited

U.S. PATENT DOCUMENTS

2007/0013413 A1    1/2007  Chiang et al.
2007/0020837 A1*   1/2007  Bryant et al. ................. 438/199

OTHER PUBLICATIONS

Barrows et al., U.S. Appl. No. 11/560,126, Office Action Communication, Apr. 14, 2009, 9 pages.

Barrows et al., U.S. Appl. No. 11/560,126, Office Action Communication, Dec. 30, 2009, 6 pages.

Barrows et al., U.S. Appl. No. 11/560,126, Notice of Allowance, Jun. 22, 2010.

Barrows et al., U.S. Appl. No. 11/560,126, Office Action Communication, Aug. 21, 2008, 7 pages.

* cited by examiner

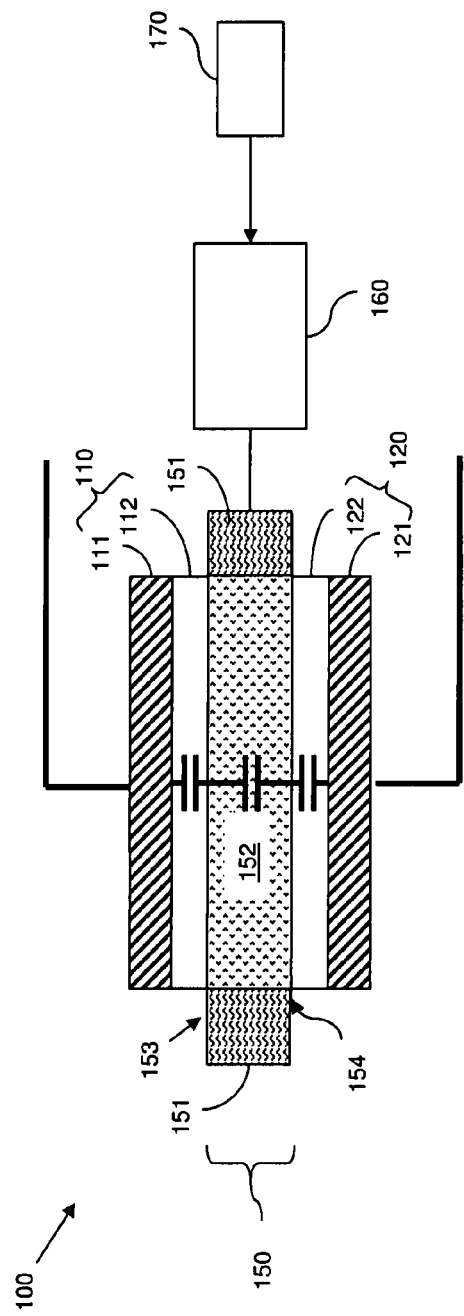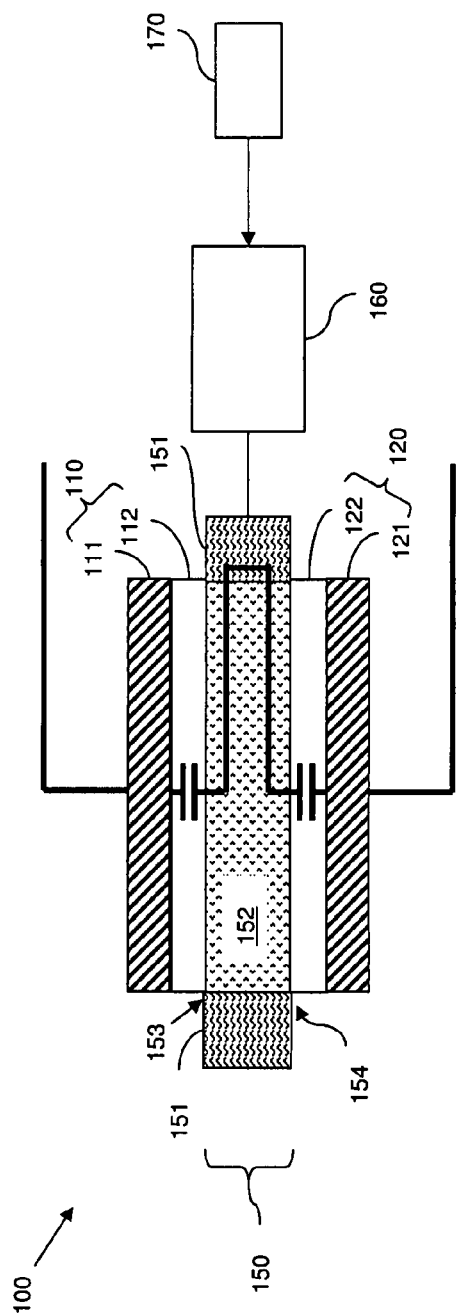

TUNABLE CAPACITOR

CROSS-REFERENCE TO RELATED APPLICATIONS

This application is related to U.S. application Ser. No. 11/560,126 filed Nov. 15, 2006, issued as U.S. Pat. No. 7,821,053 on Oct. 26, 2010, the complete disclosure of which, in its entirety, is herein incorporated by reference.

BACKGROUND

1. Field of the Invention

The embodiments of the invention generally relate to capacitors and, more particularly, to a capacitor structure that allows for modulation of the capacitance value.

2. Description of the Related Art

Various integrated circuit applications require the incorporation of tunable capacitors (e.g., in delay lines, load tuners, etc.). However, currently available tunable capacitor structures are limited in terms of continued size scaling (e.g., due to dopant fluctuations, current leakages, etc.). Therefore, there is a need in the art for an improved tunable capacitor structure that lends itself to continued size scaling comparable to that of other semiconductor devices (e.g., current state of the art field effect transistors (FETs)).

SUMMARY

In view of the foregoing, disclosed herein are embodiments of a back gate transistor that operates as a capacitor and an associated method of tuning capacitance within such a capacitor. The embodiments of the capacitor structure comprise a field effect transistor with front and back gates above and below a semiconductor layer, respectively.

The capacitance value exhibited by the capacitor can be selectively varied between different values by changing the voltage condition in a selected region or regions of the capacitor. Specifically, the capacitor can comprise a semiconductor layer and a first gate on a first surface of the semiconductor layer and at least one second gate on a second surface of the semiconductor layer opposite the first gate. The semiconductor layer is adapted to change a capacitance value of the capacitor depending upon an amount of voltage that is either applied to a doped region adjacent to a channel region within the semiconductor layer or applied to one or more of multiple channel regions between multiple doped regions within the semiconductor layer.

That is, the capacitance value can be varied between two different values by changing the voltage condition within a doped source/drain region of the transistor. Applying a first voltage value (e.g., a value above a predetermined threshold) to the doped region causes the capacitor to exhibit a first capacitance value and applying a second voltage value (e.g., a value below the predetermined threshold) to the doped region causes the capacitor to exhibit a second capacitance value. Alternatively, the capacitance value exhibited by the capacitor can be selectively varied between multiple different values by changing voltage conditions on multiple channel regions that are flanked by multiple doped source/drain regions within the semiconductor layer (e.g., using a separate back gate to selectively control the threshold voltage of each channel region). The capacitor will exhibit different capacitance values depending upon the conductivity in each of the channel regions.

More specifically, in one embodiment of the structure, the capacitor comprises a field effect transistor. The transistor comprises a semiconductor layer having a first surface and a second surface. The semiconductor layer comprises a central channel region disposed by one, two, or more, doped source/drain regions. The transistor further comprises front and back gates above and below the channel region of the semiconductor layer (i.e., a first gate on a first surface of the semiconductor layer adjacent to the channel region and a second gate on a second surface of the semiconductor layer adjacent to the channel region and opposite the first gate). Each of the gates comprises a gate dielectric layer adjacent to the semiconductor layer and a gate conductor layer on the gate dielectric layer.

The capacitor further comprises a device (e.g., a switch, such as a pass-gate or transmission-gate, a resistor, an inductor, a digital-to-analog converter, etc,) that is adapted to selectively alternate (e.g., between a first voltage value and a second voltage value) an amount of voltage applied to one of the doped regions. Applying the first voltage value to the doped region causes the capacitor to exhibit a first capacitance value and applying the second voltage value to the doped region causes the capacitor to exhibit a second capacitance value.

In another embodiment of the structure, the capacitor similarly comprises a field effect transistor. The transistor comprises a semiconductor layer having a first surface and a second surface. The semiconductor layer comprises multiple channel regions and multiple doped source/drain regions. The channel regions and source/drain regions are configured such that each channel region is flanked by one, two, or more, doped regions. The doped regions can each be electrically connected to ground, to a supply voltage (Vdd), to an intermediate voltage, etc. The transistor further comprises front and back gates above and below the semiconductor layer (i.e., first and second gates, respectively). Each of the gates comprises a dielectric layer adjacent to the semiconductor layer and a conductive layer on the dielectric layer.

Specifically, the transistor can comprise a first gate that extends across the length of the semiconductor layer on the first side between the end-most doped regions (i.e., between a first doped region and last doped region). The first gate can be adapted to turn on the channel regions. Alternatively, the transistor can comprise a plurality of first gates adjacent to the first surface of the semiconductor layer. These multiple first gates are electrically isolated from each other and each one is positioned adjacent to a corresponding one of the channel regions between doped regions. Each first gate is adapted to turn on its corresponding channel region. Additionally, the transistor can comprise a plurality of second gates adjacent to the second surface of the semiconductor layer. These second gates are electrically isolated from each other and each one is positioned adjacent to a corresponding one of the channel regions between doped regions. Each one of the second gates is adapted to selectively control the threshold voltage of its corresponding channel region. Thus, any one or more of the channel regions within the transistor can selectively be turned on so that conductivity is high. Varying which, if any, of the channel regions is turned on will vary the capacitance value of the capacitor.

An embodiment of a method of selectively varying a capacitance value of a capacitor comprises providing a capacitor that comprises a field effect transistor with front and back gates above and below a semiconductor layer, respectively (i.e., at least one first gate on a first surface of the semiconductor layer and at least one second gate on a second surface of the semiconductor layer). Then, in order to vary the capacitance value of the capacitor, a voltage condition is changed in a selected region or regions of the transistor (e.g., in either a doped source/drain region within the semiconductor layer or on one or more multiple channel regions within the semiconductor layer. The voltage condition on a doped source/drain region can be changed by selectively alternating an amount of voltage applied to the doped region between a first voltage value and a second voltage value such that when the first voltage value is applied to the doped region the capacitor exhibits a first capacitance value and when the second voltage value is applied to the doped region the capacitor exhibits a second capacitance value. Alternatively, the voltage condition on one or multiple channel regions can be changed by using multiple back gates to selectively control the individual threshold voltages of the channel regions such that any one or more of the channel regions within the transistor can selectively be turned on so that conductivity is high. Varying which, if any, of the channel regions is turned on will vary the capacitance value of the capacitor.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 1a-b are schematic diagrams illustrating an embodiment of the capacitor of the invention;

DETAILED DESCRIPTION OF EMBODIMENTS

Figure 2:
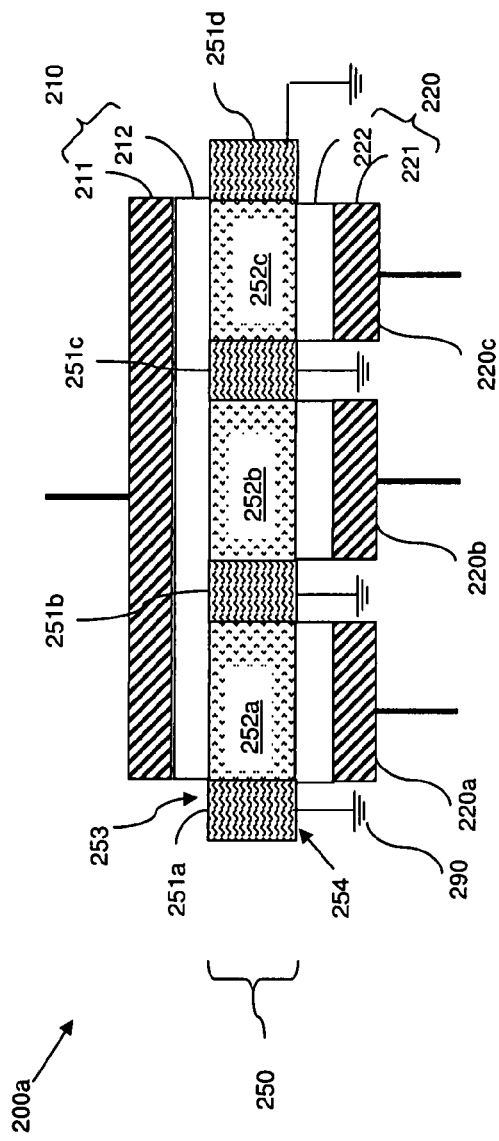
FIG. 2 is a schematic diagram illustrating another embodiment of the capacitor of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, various integrated circuit applications require the incorporation of tunable capacitors (e.g., in delay lines, load tuners, etc.). However, currently available tunable capacitor structures are limited in terms of continued size scaling (e.g., due to dopant fluctuations, current leakages, etc.). In complementary metal oxide semiconductor (CMOS) devices and, specifically, in field effect transistors, continued size scaling at or beyond the 32 nm node has recently been enabled by dual gate structures in which a back gate is used to adjust threshold voltage. This back-gate technology provides new opportunities for innovative structures and circuits.

In view of the foregoing, disclosed herein is a new solution for tuning capacitance in circuits by taking advantage of such back gate structures. Specifically, disclosed herein are embodiments of a back gate transistor that operates as a capacitor and an associated method of tuning capacitance within such a capacitor.

The embodiments of the capacitor structure (see capacitor 100 of FIGS. 1*a-b*, capacitor 200*a* of FIG. 2 and capacitor 200*b* of FIG. 3) each comprise a field effect transistor with front and back gates above and below a semiconductor layer, respectively (i.e., at least one first gate 110, 210 on a first surface 153, 253 of the semiconductor layer 150, 250 and at least one second gate 120, 220 on a second surface 154, 254 of the semiconductor layer 150, 250). The capacitance value exhibited by the capacitor 100, 200*a*, 200*b* can be selectively varied by selectively changing the voltage conditions in different regions of the capacitor. Specifically, the capacitor can comprise a semiconductor layer and a first gate on a first surface of the semiconductor layer and at least one second gate on a second surface of the semiconductor layer opposite the first gate. The semiconductor layer is adapted to change a capacitance value of the capacitor depending upon an amount of voltage that is either applied to a doped region adjacent to a channel region within the semiconductor layer or applied to one or more of multiple channel regions between multiple doped regions within the semiconductor layer. For example, the capacitance value in capacitor 100 of FIGS. 1*a-b* can be changed between two different values by changing the voltage condition in a doped region 151 within the semiconductor layer 150 (e.g., within one of the source/drain regions of the transistor). To accomplish this, the capacitor 100 may comprise a device 160 that is electrically connected between one of the doped source/drain regions 151 and a voltage supply 170. This device 160 can be adapted to selectively alternate an amount of voltage applied to the doped region 151 between a first voltage value and a second voltage value. Applying a first voltage value (e.g., a value above a predetermined threshold value) to the doped region 151 causes the capacitor 100 to exhibit a first capacitance value and applying a second voltage value (e.g., a value below the predetermined threshold) to the doped region 151 causes the capacitor 100 to exhibit a second capacitance value. Alternatively, the capacitance value exhibited by the capacitor 200*a* of FIG. 2 and 200*b* of FIG. 3 can be selectively varied between multiple different values by changing voltage conditions on multiple channel regions 252*a-c* that are flanked by doped regions 251*a-d* (i.e., multiple source/drain regions) within the semiconductor layer 250. For example, the capacitor 200*a*, 200*b* can comprise multiple back gates 220*a-c*, each of which is positioned adjacent to a corresponding one of the multiple channel regions 252*a-c* within the semiconductor layer 250 and each of which is further selectively controlled to vary the threshold voltage of that corresponding channel region. The capacitor 200*a*, 200*b* will exhibit different capacitance values depending upon the conductivity in each of the channel regions.

More specifically, referring to FIGS. 1*a* and 1*b*, in one embodiment of the structure, the capacitor 100 comprises a field effect transistor (FET). The transistor comprises a semiconductor layer 150 having a first surface 153 and a second surface 154. The semiconductor layer 150 comprises a central region 152 (i.e., a channel region) flanked by two doped end regions 151 (i.e., disposed between two source/drain regions that are "floated" from an alternating current (AC) point of view). For example, if the transistor comprises an n-type FET, the doped regions 151 can be doped with an n-type dopant (e.g., phosphorus (P), arsenic (As) or antimony (Sb)). Alternatively, if the transistor comprises a p-type FET, the doped regions 151 can be doped with a p-type dopant (e.g., boron). The transistor further comprises front and back gates above and below the channel region of the semiconductor layer (i.e., a first gate 110 on a first surface 153 of the semiconductor layer 150 adjacent to the channel region 152 and between the doped regions 151 and a second gate 120 on a second surface 154 of the semiconductor layer 150 adjacent to the channel region 152 and between the doped regions 151, opposite the first gate 110). Each of the gates 110, 120 comprises a gate dielectric layer 112, 122 adjacent to the semiconductor layer 150 and a gate conductor layer 111, 121 on the dielectric layer. Thus, the capacitor 100 is formed between the front and back gates 110, 120.

The capacitor 100 further comprises a device 160 that is adapted to selectively alternate an amount of voltage (e.g., between a first voltage value and a second voltage value) that is applied from a constant (i.e., stable) voltage source to the one doped region. Applying the first voltage value to the doped region 151 causes the capacitor 100 to exhibit a first capacitance value and applying the second voltage value to the doped region 151 causes the capacitor 100 to exhibit a second different capacitance value.

For example, applying a first voltage that has a value above a predetermined threshold value to the doped region 151 (i.e., adjusting the potential of the doped region above the threshold voltage (Vt) for both the front and back gates 110, 120) causes the doped region 151 to remain fully depleted such that it functions as an insulator and no channel is formed. Furthermore, the potential of the doped region is limited so as not to become so positive that accumulation of the channel region by either or both gates occurs, by keeping the channel voltage below the flat-band voltage, with respect to the gates. Therefore, the series capacitance of the front dielectric 112, the back dielectric 122 and the body thickness 150, form a low-value capacitance between the gate conductors 111, 112. Specifically, referring to FIG. 1a, the semiconductor layer 150 and gate dielectric layers 112 and 122 function as a composite dielectric between two conductive plates (i.e., gate conductors 111, 121 such that the capacitor 100 exhibits a low capacitance value (i.e., operates in a low capacitance (C) mode). More specifically, if Vg1−Vn+<Vt1 AND Vg2−Vn+<Vt2, then C=Cox1*Cox2*Cdep/(Cox1*Cox2+Cox2*Cdep+Cdep*Cox1), where Vg1 is the voltage condition at gate 110, Vn+ is the voltage condition at the doped region 151, Vt1 is the threshold voltage of gate 110 for the applied conditions, Vt2 is the threshold voltage of gate 120 for the applied conditions, Cox1 is the value of the capacitance from the gate 110 to the channel formed adjacent to gate 110, when inverted, Cox2 is the value of the capacitance from gate 120 to the channel formed adjacent to gate 120 when inverted, and Cdep is the value of the capacitance between the channels formed adjacent to gates 110 and 120. Furthermore, to avoid accumulation of the channel region, Vg1−Vn+>Vfb1 AND Vg2−Vn+>Vfb2, where Vfb1 and Vfb2 are the flat-band voltages of gate 110 and gate 120, respectively, to the channel region.

Whereas, applying a second voltage, having a value that is below the predetermined threshold value, to the doped region 151 (i.e., floating the potential of the doped region below the threshold voltage (Vt) for both the front and back gates 110, 120) changes the conductivity of the doped region to high and, thereby, allows inverted regions (i.e., channels that are formed) on the top surface 153 and bottom surface 154 of the semiconductor layer 150 to be electrically connected. Thus, referring to FIG. 1b, instead of a composite dielectric that includes the semiconductor layer 150, capacitance is provided by the series combination of two dielectrics (i.e., the gate dielectrics 112, 122) between three conductive plates (i.e., the gate conductors 111, 121 and the semiconductor layer 150) such that the capacitor 100 exhibits a high capacitance value (i.e., operates in a high C mode). More specifically, if Vg1−Vn+>Vt1 AND Vg2−Vn+>Vt2, then C=Cox1*Cox2/(Cox1+Cox2), where the variables are the same as set out above.

In order to alternate the voltage values applied to the doped region 151, the device 160 can comprise an intermittent connection, such as a switch (e.g., a pass-gate switch, a transmission-gate, etc.), thereby allowing the voltage value to alternate on demand between a first voltage value that is above a predetermined threshold value and a second voltage value that is below a predetermined threshold voltage. Alternatively, the device 160 can comprise device, such as a resistor, an inductor with impedance that is large compared to that of the capacitor, or a digital-to-analog converter, that similarly allows the voltage applied to the doped region to alternate (i.e. be switched) between a value above a predetermined threshold value (i.e., the first voltage value) and a value below a predetermined threshold voltage (i.e., the second voltage value).

Figure 3:
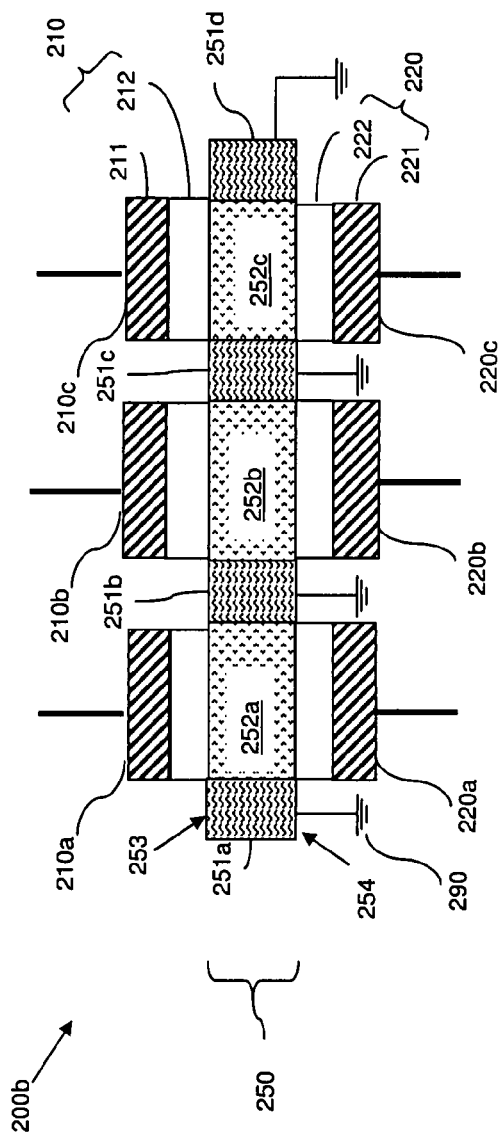
FIG. 3 is a schematic diagram illustrating an alternative structure for the embodiment of FIG. 2.
Figure 4:
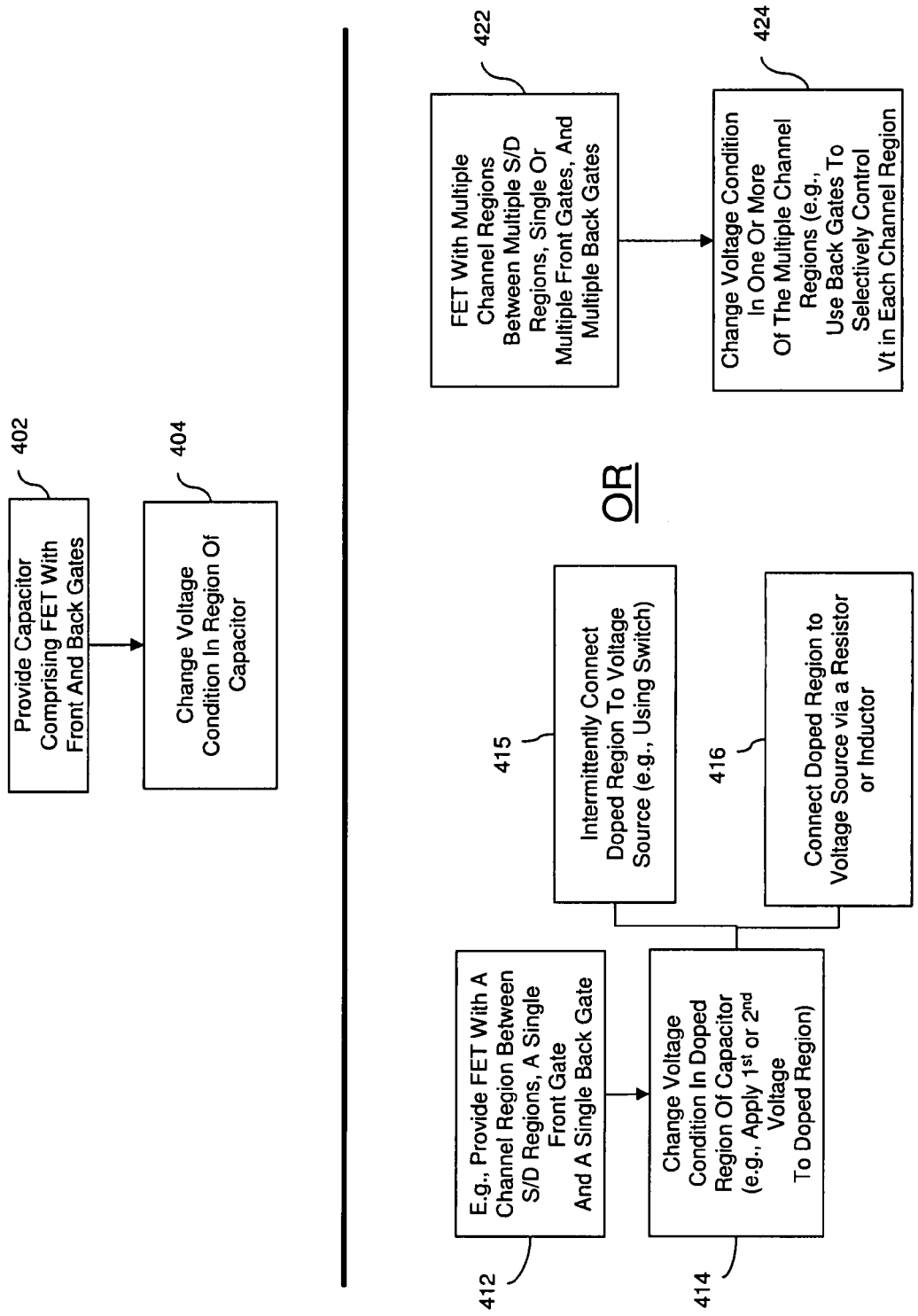
FIG. 4 is a flow diagram illustrating embodiments of a method of the invention.

Referring to FIGS. 2 and 3, in another embodiment of the structure, the capacitor 200a of FIG. 3 and 200b of FIG. 4 similarly comprises a field effect transistor. The transistor comprises a semiconductor layer 250 having a first surface 253 and a second surface 254. The semiconductor layer 150 comprises multiple channel regions 252a-c and multiple doped regions 251a-d (i.e., source/drain regions). For example, if the transistor comprises an n-type FET, the doped regions 251a-d can be doped with an n-type dopant (e.g., phosphorus (P), arsenic (As) or antimony (Sb)). Alternatively, if the transistor comprises a p-type FET, the doped regions 251a-d can be doped with a p-type dopant (e.g., boron). The channel regions 252a-c and doped regions 251a-d are configured such that they are alternate. Specifically, each channel region 252a-c is flanked by two doped regions 251a-d. The doped regions 251a-d are each electrically connected to ground 290 or, alternatively, to a supply voltage (Vdd) or to an intermediate voltage. The transistor further comprises front and back gates above and below the semiconductor layer 250 (i.e., first and second gates 210, 220, respectively). Each of the gates 210, 220 comprises a dielectric layer 212, 222 adjacent to the semiconductor layer 250 and a conductive layer 211, 221 on the dielectric layer.

Specifically, referring to the capacitor 200a of FIG. 2, the transistor can comprise a single first gate 210 that extends across the length of the semiconductor layer 250 on the first side 253 between the end-most doped regions (i.e., between a first doped region 251a and last doped region 251d). The single first gate 210 can be adapted to turn on all of the channel regions 252a-c. Alternatively, referring to the capacitor 200b of FIG. 3, the transistor can comprise a plurality of first gates 210a-c adjacent to the first surface 253 of the semiconductor layer 250. These first gates 210a-c are electrically isolated from each other and each one is positioned adjacent to a corresponding one of the channel regions 252a-c between two doped regions 251. Each first gate 210a-c is adapted to individually turn on its corresponding channel region 252a-c.

Additionally, the transistor can comprise a plurality of second gates 220a-c adjacent to the second surface 254 of the semiconductor layer 250. These second gates 220a-c are electrically isolated from each other and each one is positioned adjacent to a corresponding one of the channel regions 252a-c between two doped regions 251. Each one of the second gates 220a-c is adapted to selectively control the threshold voltage (Vt) of the corresponding one of the channel regions 252a-c. Thus, any one or more of the channel regions 252a-c within the transistor can selectively be turned on so that conductivity is high within that given region. Varying which, if any, of the channel regions 252a-c is turned on will vary the capacitance value of the capacitor (i.e., the capacitor will exhibit different capacitance values depending on the conductivity in each of the channel regions). That is, the capacitance between the top and bottom gates is a function of the aggregate number of channels established in the various channel regions between the doped regions. For example, if all of the back gates are off (i.e., each channel region has a high threshold voltage), the capacitance value will be low because the only capacitance exhibited is between the gates and individual doped regions. However, by turning on a single back gate (e.g., 220a), a parallel plate dielectric is added in the corresponding section of the capacitor and, thereby, adds capacitance. Consequently, with each back gate 220a-c that is turned on simultaneously, additional capacitance is added.

In this mode of invention, the electrical biases are provided to each back gate 220a-c via an effectively high impedance element such as a pass-gate, a transmission-gate, a high-valued resistor, an inductor or an analog-to-digital converter, as discussed in the earlier modes.

Referring to FIG. 4, an embodiment of a method of selectively varying a capacitance value of a capacitor comprises providing a capacitor, e.g., as illustrated in FIG. 1, 2 or 3 (402). Specifically, a capacitor that comprises a field effect transistor with front and back gates above and below a semiconductor layer, respectively (i.e., at least one first gate on a first surface of the semiconductor layer and at least one second gate on a second surface of the semiconductor layer) is provided. Then, in order to vary the capacitance value of the capacitor, a voltage condition is changed on either a doped region within the semiconductor layer or on one or more of multiple channel regions within the semiconductor layer (404).

For example, a capacitor 100 with a channel region 152 between source/drain regions 151, a single front gate 110 on one side 153 of the channel region 152 and a single back gate 120 on the opposing side 154 of the channel region 152 can be provided (412, see FIGS. 1a-b and detailed discussion above). The voltage condition on one of the source/drain regions 151 (i.e., a doped region) of the capacitor 100 can be changed by selectively alternating an amount of voltage applied to the doped region 151 between a first voltage value and a second voltage value such that when the first voltage value is applied to the doped region the capacitor exhibits a first capacitance value and when the second voltage value is applied to the doped region the capacitor exhibits a second different capacitance value (414). For example, for an n-type device, applying a first voltage that has a value greater than a predetermined threshold value to the doped region 151 (i.e., adjusting the potential of the doped region above the threshold voltage (Vt) for both the front and back gates 110, 120) causes the channel region 152 to remain fully depleted such that it functions as an insulator and no channel is formed. Furthermore, the potential of the doped region is limited so as not to become so positive that accumulation of the channel region by either or both gates occurs, by keeping the voltage of the doped region below the flat-band voltage with respect to the gates 110, 120. Therefore, the series capacitance of the front dielectric 112, the back dielectric 122 and the body thickness 150, form a low-value capacitance between the gate conductors 111, 112 (see FIG. 1a and discussion above). Whereas, applying a second voltage, having a value less than the predetermined threshold value, with respect to the doped region 151 (i.e., floating the potential of the doped region below the threshold voltage (Vt) for both the front and back gates 110, 120) changes the conductivity of the channel region to a high value and, thereby, allows inverted regions (i.e., channels that are formed) on the top surface 153 and bottom surface 154 of the semiconductor layer 150 to be electrically connected via the doped region(s). Thus, referring to FIG. 1b, instead of a composite dielectric that includes the semiconductor layer 150, capacitance is provided by the series combination of two dielectrics (i.e., the gate dielectrics 112, 122) between three conductive plates (i.e., the gate conductors 111, 121 and the semiconductor layer 150) such that the capacitor 100 exhibits a high capacitance value (i.e., operates in a high C mode). This process 414 can be accomplished by either intermittently connecting the doped region to a constant (i.e., stable) voltage source, e.g., using a switch, such as a transmission-gate or pass-gate, (415) or via a sufficiently high value of resistance or inductance between the voltage source and doped region (e.g., using a resistor, inductor, analog-to-digital converter, etc.) (416). In particular, a resistor can be used if the resistor has a value $R \gg t/C$, where t is the effective time scale which the capacitor must function in the circuit, and similarly the inductance can be of value $L \gg t^2/C$, where C is the value of capacitance in use.

Alternatively, a capacitor 200a or 200b with multiple channel regions 252a-c disposed between multiple source drain regions 251a-d within a semiconductor layer 250, a single or multiple first gates 210, and multiple second gates 220a-c can be provided (422, see FIGS. 2 and 3 and detail discussion above). The multiple second gates can be positioned on the second surface 254 of the semiconductor layer 250 such that each one of the second gates 220a-c corresponds to one of the channel regions 252a-c. Then, the voltage condition on any one or more of the multiple channel regions can be changed by selectively controlling the threshold voltage of each of the multiple channel regions (424). Thus, any one or more of the channel regions within the transistor can selectively be turned on so that conductivity is high.

Varying which, if any, of the channel regions 252a-c is turned on will vary the capacitance value of the capacitor (i.e., the capacitor will exhibit different capacitance values depending on the conductivity in each of the channel regions). That is, the capacitance between the top and bottom gates is a function of the aggregate number of channels established in the various channel regions between the doped regions. For example, if all of the back gates are off (i.e., each channel region has a high threshold voltage, as determined by a low voltage on the back gate of that region), the capacitance value will be low because the capacitance exhibited is between the gates via the channel region. However, by turning on a single back gate (e.g., 220a), a parallel plate dielectric is added in the corresponding section of the capacitor and, thereby, adds capacitance. Consequently, with each back gate 220a-c that is turned on simultaneously, additional capacitance is added. In this mode of invention, the electrical biases are provided to each back gate 220a-c via an effectively high impedance element such as a pass-gate, a transmission-gate, a high-valued resistor, an inductor or an analog-to-digital converter, as discussed in the earlier modes.

Figure 5:
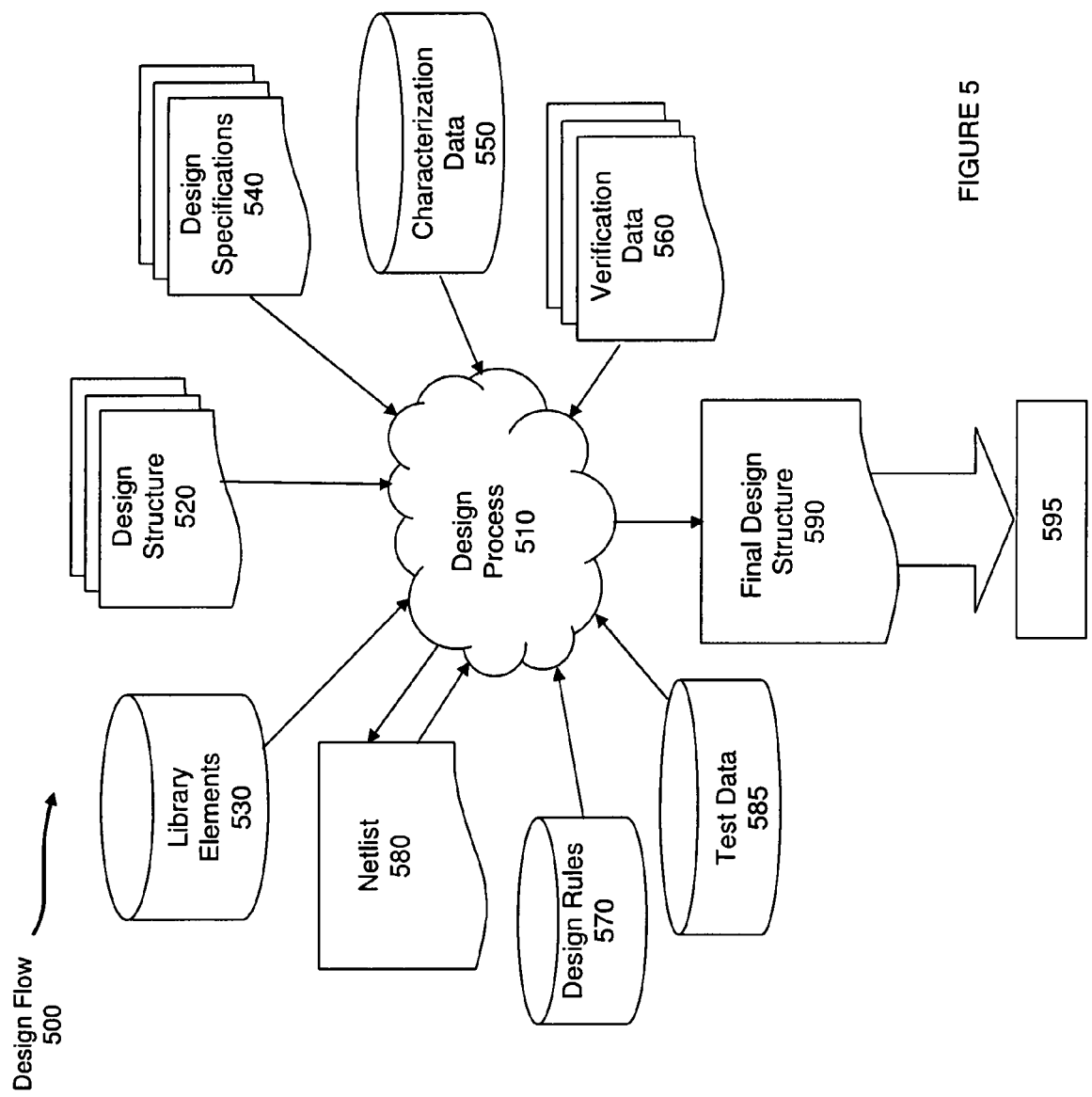
FIG. 5 is a flow diagram of a design process used in semiconductor design, manufacturing, and/or test.

FIG. 5 shows a block diagram of an example design flow 500. Design flow 500 may vary depending on the type of IC being designed. For example, a design flow 500 for building an application specific IC (ASIC) may differ from a design flow 500 for designing a standard component. Design structure 520 is preferably an input to a design process 510 and may come from an IP provider, a core developer, or other design company or may be generated by the operator of the design flow, or from other sources. Design structure 520 comprises circuits 100, 200a, and 200b in the form of schematics or HDL, a hardware-description language (e.g., Verilog, VHDL, C, etc.). Design structure 520 may be contained on one or more machine readable medium. For example, design structure 520 may be a text file or a graphical representation of circuits 100, 200a, and 200b. Design process 510 preferably synthesizes (or translates) circuits 100, 200a, and 200b into a netlist 580, where netlist 580 is, for example, a list of wires, transistors, logic gates, control circuits, I/O, models, etc. that describes the connections to other elements and circuits in an integrated circuit design and recorded on at least one of machine readable medium. This may be an iterative process in which netlist 580 is resynthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology (e.g., different technology nodes, 32 nm, 45 nm, 90 nm, etc.), design specifications 540, characterization data 550, verification data 560, design rules 570, and test data files 585 (which may include test patterns and other testing information). Design process 510 may further include, for example, standard circuit design processes such as timing analysis, verification, design rule checking, place and route operations, etc. One of ordinary skill in the art of integrated circuit design can appreciate the extent of possible electronic design automation tools and applications used in design process 510 without deviating from the scope and spirit of the invention. The design structure of the invention is not limited to any specific design flow.

Design process 510 preferably translates an embodiment of the invention as shown in FIG. 5, along with any additional integrated circuit design or data (if applicable), into a second design structure 590. Design structure 590 resides on a storage medium in a data format used for the exchange of layout data of integrated circuits (e.g. information stored in a GDSII (GDS2), GL1, OASIS, or any other suitable format for storing such design structures). Design structure 590 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 5. Design structure 590 may then proceed to a stage 595 where, for example, design structure 590: proceeds to tape-out, is released to manufacturing, is released to a mask house, is sent to another design house, is sent back to the customer, etc Therefore, disclosed herein are embodiments of a back gate transistor that operates as a capacitor and an associated method of tuning capacitance within such a capacitor. The embodiments of the capacitor structure comprise a field effect transistor with front and back gates above and below a semiconductor layer, respectively. The capacitance value exhibited by the capacitor can be selectively varied between two different values by changing the voltage condition in a source/drain region of the transistor, e.g., using a switch, a resistor, an inductor, analog-to-digital converter, etc., between the source/drain region and a voltage supply. Alternatively, the capacitance value exhibited by the capacitor can be selectively varied between multiple different values by changing voltage conditions one or more of multiple channel regions that are flanked by multiple source/drain regions within the transistor. The capacitor will exhibit different capacitance values depending upon the conductivity in each of the channel regions. The tunable capacitors disclosed herein can be incorporated into integrated circuits structures as delay lines, load tuners, etc. However, given that the structure of these tunable capacitors is based on that of current state of the art back gate transistor technology, size scaling of the capacitors can be in line with that achievable with back gate transistors such that they are not subject to the same limitations imposed by dopant fluctuations, leakage limits, etc., seen with prior art tunable capacitors.

Benefits that flow from this invention include improved flexibility in capacitive loading and coupling of circuits, improved isolation of control elements from active elements which results in improved quality factor.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:
1. A system comprising:
a design structure for manufacturing an integrated circuit device, said design structure comprising: at least layout parameters, test pattern and other testing information, and manufacturing line routing information, said design structure being embodied in a non-transitory storage medium of said system; and,
a machine, said storage medium being readable by said machine and said machine processing said design structure embodied in said storage medium to produce an embodiment of said integrated circuit device comprising:
a capacitor comprising:
a semiconductor layer having a first surface, a second surface opposite said first surface, a center region extending vertically from said first surface and said second surface and at least one doped region positioned laterally adjacent to said center region; and
opposing gates on said first surface and said second surface adjacent to said center region, said opposing gates comprising:
a first gate comprising a first gate dielectric layer on said first surface and a first gate conductor layer on said first gate dielectric layer; and
a second gate comprising a second gate dielectric layer on said second surface and a second gate conductor layer on said second gate dielectric layer;

a constant voltage source; and a device comprising any one of a digital-to-analog converter, a resistor and an inductor, said device being electrically connected in series between said constant voltage source and said doped region and said device tuning said capacitor by alternatingly applying, to said doped region, a first voltage value to achieve a first capacitance value and a second voltage value different from said first voltage value to achieve a second capacitance value, said first voltage value being above a predetermined threshold voltage for both said opposing gates such that, within said capacitor, said first gate conductor layer and said second gate conductor layer comprise capacitor plates and said first dielectric layer, said second dielectric layer and said semiconductor layer in combination comprise a single capacitor dielectric between said capacitor plates, and said second voltage value being below said predetermined threshold voltage such that, within said capacitor, said first gate conductor layer comprises a first capacitor plate, said second gate conductor layer comprises a second capacitor plate, said semiconductor layer comprises an additional capacitor plate, said first gate dielectric layer comprises a first capacitor dielectric between said first capacitor plate and said additional capacitor plate and said second gate dielectric layer comprises a second capacitor dielectric between said additional capacitor plate and said second capacitor plate.

2. The system according to claim 1, each of said gates comprising a gate dielectric layer adjacent to said semiconductor layer and a gate conductor layer on said gate dielectric layer.

3. The system according to claim 1, said first voltage value being above said predetermined threshold voltage to form a relatively low-value capacitance and said second voltage value being below said predetermined threshold voltage to form a high-value capacitance relative to said low-value capacitance.

4. The system according to claim 1, said design structure further comprising a netlist which describes said integrated circuit device.

5. The system according to claim 1, said design structure residing on said storage medium as a data format used for the exchange of layout data of integrated circuits.

6. The system according to claim 1, said design structure further comprising at least one of test data files, characterization data, verification data, and design specifications.

7. A system comprising:

a design structure for manufacturing an integrated circuit device, said design structure comprising: at least layout parameters, test pattern and other testing information, and manufacturing line routing information, said design structure being embodied in a non-transitory storage medium of said system; and, a machine, said storage medium being readable by said machine and said machine processing said design structure embodied on said storage medium to produce an embodiment of said integrated circuit device comprising:

a capacitor comprising:

a semiconductor layer having a first surface and a second surface opposite said first surface, said semiconductor layer comprising alternating doped regions and channel regions positioned laterally within said semiconductor layer, a single first gate on said first surface, said single first gate extending laterally across said first surface so as to be positioned adjacent to each of said channel regions and also adjacent to each inner doped region positioned laterally between said channel regions, wherein outer doped regions of said semiconductor layer extend laterally beyond said first gate; and a plurality of individually selectable second gates on said second surface opposite said single first gate, said second gates being electrically isolated from each other and -each one of said second gates being positioned adjacent to a corresponding one of said channel regions and independently and selectively controlling a threshold voltage of said corresponding one of said channel regions so as to individually and selectively control conductivity of said corresponding one of said channel regions, said capacitor exhibiting varying capacitance values as a function of said conductivity in each of said channel regions.

8. The system according to claim 7, each one of said second gates selectively controlling a threshold voltage of said corresponding one of said channel regions.

9. The system according to claim 7, said capacitor exhibiting different capacitance values depending on a conductivity in each of said channel regions.

10. The system according to claim 7, said design structure further comprising a netlist which describes said integrated circuit device.

11. The system according to claim 7, said design structure residing on said storage medium as a data format used for the exchange of layout data of integrated circuits.

12. The system according to claim 7, said design structure further comprising at least one of test data files, characterization data, verification data, and design specifications.

* * * * *